United States Patent [19]

Nichols

[11] 4,155,050

[45] May 15, 1979

[54] LOOP PHASE DETECTOR CIRCUIT

[75] Inventor: Richard A. Nichols, Richardson, Tex.

[73] Assignee: Rockwell International Corporation, El Segundo, Calif.

[21] Appl. No.: 952,162

[22] Filed: Oct. 17, 1978

[51] Int. Cl.² ............................................. H03B 3/04
[52] U.S. Cl. ................................. 331/17; 331/1 A
[58] Field of Search ................. 331/1 A, 17, 25, 26, 331/27, 18; 307/295; 328/155; 325/420

[56] References Cited

FOREIGN PATENT DOCUMENTS 1495203  12/1977  United Kingdom .................. 331/17

Primary Examiner—John Kominski

[57] ABSTRACT

A loop phase detector circuit in which the phase offset error arising from imperfections in the circuit parameters, inter alia, temperature and power supply voltage, is reduced to a minimum by the circuit arrangement disclosed herein. The phase comparator circuit compares the phase of the output frequency of a voltage to frequency converter with an input reference signal, and provides, in complementary form, a phase comparison error signal and the complement of a phase comparison error signal. Due to temperature and supply voltage fluctuation of the circuit, the phase comparison error signal and the complementary phase comparison error signal may not be symmetrical in amplitude and may contain offset errors not directly related to phase errors. Therefore, the phase comparison error signal is applied to an input of a difference amplifier and the algebraic sum of the phase comparison error signal and the complementary phase comparison signal is applied to the other input terminal of the difference amplifier with the result between the two signals being the control voltage for a voltage control oscillator. There is a resistive network which is used to algebraically sum the phase comparison error signal and the complementary phase comparison signal in line between the phase comparison circuit and the difference amplifier which cross couples the phase comparison error signal with the complementary phase comparison error signal, so that fluctuations due to temperature and power supply voltages are drastically reduced through the algebraic summation of the signals.

6 Claims, 2 Drawing Figures

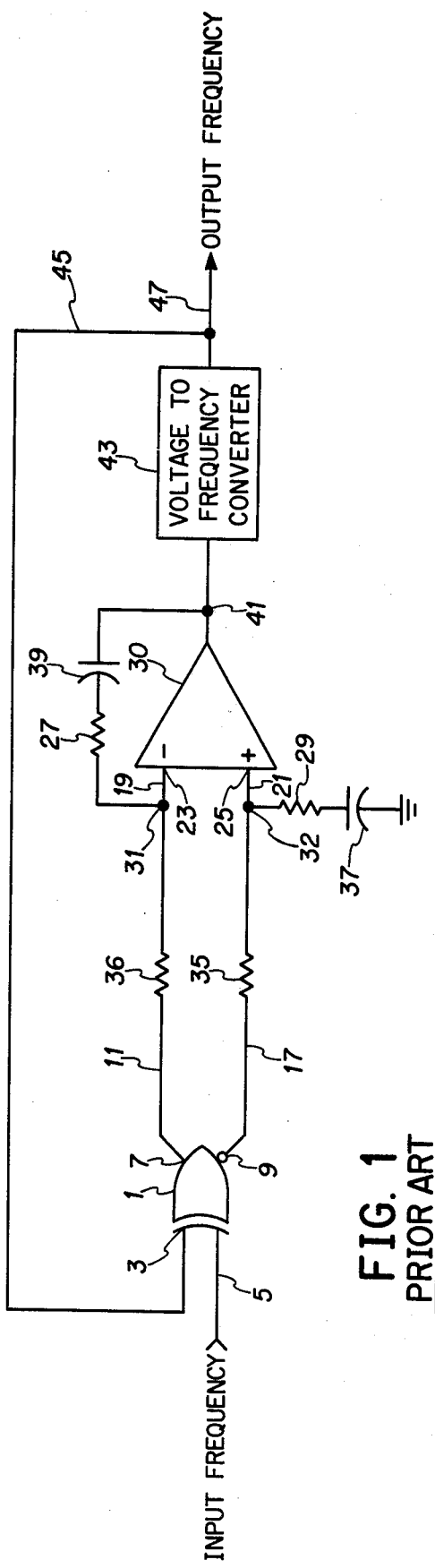
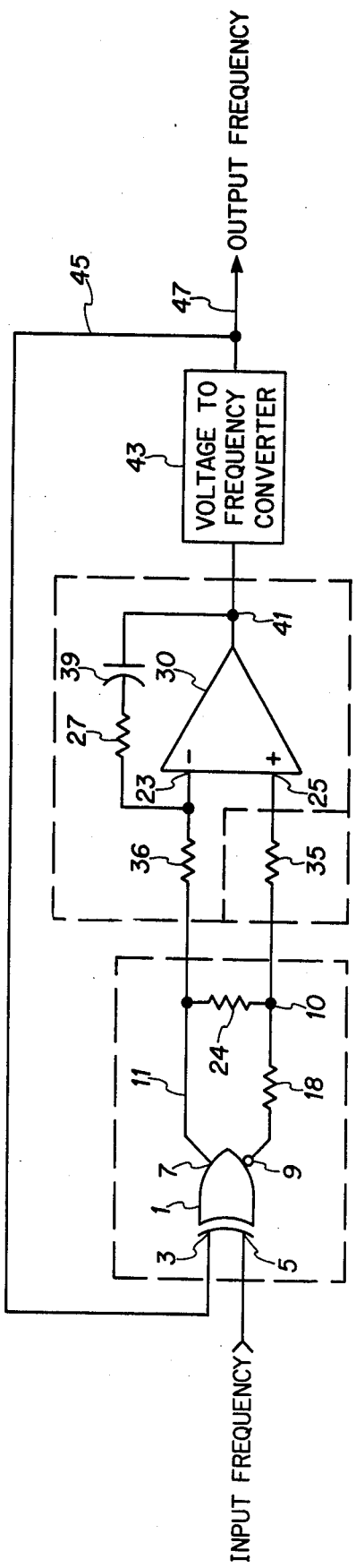
FIG. 1 PRIOR ART
FIG. 2

LOOP PHASE DETECTOR CIRCUIT

DESCRIPTION OF THE PRIOR ART AND BACKGROUND OF THE INVENTION

This invention relates to loop phase detector circuits.

In the operation of the loop phase detector circuits, such as that disclosed in U.S. Pat. No. 3,611,040, there exists the potential of an error being introduced into the circuits that is a consequence of the effects of the temperature of the circuit during operation and/or by fluctuation of the power supply voltages that are connected to the circuit. The prior art provided for minimizing these effects requires double filtering as was used in the circuit provided in FIG. 1 or by special construction of the phase comparator such as that disclosed in U.S. Pat. No. 4,039,967.

Referring to FIG. 1, a loop phase detector circuit consists of a phase comparator circuit 1 which has the advantage of being a commercially available device such as a 2-Input Exclusive "OR" Exclusive "NOR", such as part number MC10107 manufactured by Motorola Corporation, Phoenix, Ariz., and as stated earlier has two input terminals 3 and 5. Connected to terminal 3 is the output frequency of a voltage control oscillator 43 which is fed back to terminal 3 by means of conductor 45. The reference input frequency is connected to terminal 5. The phase comparator circuit 1 provides two outputs which are complementary to each other at terminals 7 and 9, and as indicated by the logic symbol used to denote the comparator 1, the Exclusive "OR" output of the two signals appears on terminal 7 and the Exclusive "NOR" output of the signals appears on terminal 9. The results of the phase comparison is applied to a difference amplifier which has two filters, the first being comprised of resistors 36 and 27 and capacitor 39, and the second filter being comprised of resistors 35 and 29 and capacitor 37. The difference of the voltages that appear on terminal 41 of difference amplifier 30 is used to control the voltage to frequency converter 43 and is the difference of the voltages present on terminals 23 and 25.

Although the circuit of FIG. 1 has been successful in compensating for the effects of the temperatures of the operating circuit and the power fluctuation of the power supplies, it has as a main disadvantage the necessity of providing two loop filters as described in the above discussion.

In addition, the circuit that was disclosed in U.S. Pat. No. 4,039,967 is a complex circuit, and as is obvious from FIGS. 6 and 8 of the patent, requires many additional components than the prior art circuit of FIG. 1 or the circuit as disclosed by the invention.

A loop phase detector circuit in which the phase offset error arising from imperfections in the circuit parameters, inter alia, temperature and power supply voltage, is reduced to a minimum by the circuit arrangement disclosed herein. The phase comparator circuit compares the phase of the output frequency of a voltage to frequency converter with an input reference signal, and provides a phase comparison error signal and the complement of the phase comparison error signal. Due to temperature and supply voltage fluctuation of the circuit, the phase comparison error signal and the complementary phase comparison error signal may not be symmetrical in amplitude and may contain other offset errors not directly related to phase errors. Therefore, the phase comparison error signal is applied to an input of a difference amplifier, and the algebraic sum of the phase comparison error signal and the complementary phase comparison signal is applied to the other input terminal of the difference amplifier, with the result between the two signals being the control voltage for a voltage control oscillator. There is a resistive network which is used to algebraically sum the phase comparison error signal and the complementary phase comparison signal in line between the phase comparison circuit and the difference amplifier which cross couples the phase comparison error signal with the complementary phase comparison error signal, so that fluctuations due to temperature and power supply voltages are drastically reduced.

Many advantages of the present invention may be ascertained from a reading of the specification and the claims in conjunction with the drawings.

BRIEF DESCRIPTION OF THE DRAWINGS

FIG. 1 is a block diagram of the prior art loop phase detector circuit; and

FIG. 2 is a block diagram of the preferred embodiment of the invention.

DETAILED DESCRIPTION OF THE INVENTION

Referring to FIG. 2, there is a phase comparator 1, the circuit of which is well-known in the art, or it can be a commercially available 2-Input Exclusive "OR" and Exclusive "NOR", that is available from sources such as Motorola Corporation under the part number of MC10107, and which compares the input reference frequency seen on terminal 5, provided from a reference source not shown, with the output frequency of voltage to frequency converter 43 that has a natural frequency. The output of the voltage to frequency converter is connected to input terminal 3 of phase comparator 1 by means of conductor 45. The phase comparator as indicated by the logic symbol diagram provides an Exclusive "OR" output of the two input signals on terminal 7 and Exclusive "NOR" output of the two input signals on terminal 9. The Exclusive "OR" output as appears on terminal 7 is an indication of whether or not the two signals that are present on terminals 3 and 5 are in phase, and is applied to the loop filter which consists of resistors 36, 27 and capacitor 39, as well as summing resistor 24. The Exclusive "NOR" terminal 9 has on its output the complement of the signal that is present on terminal 7 and it is applied to error summing resistor 18. Node 10 is the summing point of the current flow in summing resistor 24 and error summing resistor 18, which is applied to amplifier 30 through resistor 35.

In the preferred embodiment of the circuit, summing resistor 24 should be approximately equal to error summing resistor 18. Resistor 35 is the input resistor that joins node 10 with positive input terminal 25 of the amplifier 30 and has, as a general restriction, the requirement of insuring that the source resistance seen by terminal 25 is approximately equal to the source resistance as seen by terminal 23 of amplifier 30. The difference output that appears on terminal 41 is applied to the voltage to frequency converter 43, which is generally either a voltage controlled oscillator or a voltage controlled crystal oscillator for controlling the output frequency that appears on terminal 47.

THEORY OF OPERATION

Amplifier 30 provides a compensated output $V_o$ on terminal 41 that is compensated for variations of operating temperatures and fluctuations of the power supply voltages. Because $V_o$ is compensated, the voltage to frequency converter 43 only responds to the true error signal. $V_o$ can be said to be equal to the gain which we will denote as k that is established by the resistive networks 36, 27 and capacitor 39, as well as the summations of resistors 24, 35 and resistors 18 and 35. Based upon the assumption that the input impedance seen by terminal 23 is equal to the input impedance seen by terminal 25, then we can say that $V_o$ is equal to k times the voltage $V_1$ seen on conductor 11 plus k times the summation of the voltage $V_2$ seen on terminal 9 and $V_1$. Thus, $V_0 = k(V_1 + V_2 - V_1)$. Under ideal conditions, then $V_1$ should be equal to a $-V_2$ leaving the output that appears on terminal 41 equal to a gain constant of k times $V_1$. However, when there are offset errors not directly related to phase errors then $V_o$ is $k(V_1 \pm \Delta)$ with $\Delta$ being the algebraic difference between $V_1$ and $V_2$.

It is understood that various modifications may be made in the circuit or circuits of the present invention without departing from the spirit and scope of the invention except as limited by the appended claims:

What is claimed is:

1. A loop phase detector circuit comprising in cascade arrangement:
    a reference generator for providing a first and a second signal that results from comparison of a reference signal and a feedback signal;
    means for providing said reference signal to said reference generator;
    algebraic summation means electrically connected to said reference generator and providing a control signal that is the algebraic summation of the sum of said first and said second signal minus said first signal;
    signal to frequency converter means;
    means for connecting said signal to frequency converter means to said control signal, whereby in response to said control signal, said signal to frequency converter means converts said control signal to an output signal that is controlled by said control signal; and
    feedback loop means for connecting said feedback signal to an input terminal of said reference generator, said feedback signal being connected to and is the output of said signal to frequency converter.

2. The circuit arrangement according to claim 1 wherein said referenced generator includes:
    phase comparison circuit having first and second output terminals which are complementary to each other.

3. The circuit arrangement according to claim 1 wherein said algebraic summation means further comprises:
    a difference amplifier means;
    a first and second resistor means electrically connected together on one end forming a node point, said first resistor means being electrically connected to said first signal of said reference generator on its other end and said second resistor means being connected to said second signal of said reference generator on its other end;
    means for connecting said first signal to an input terminal of said difference amplifier means; and
    means for connecting said node point to a second input terminal of said difference amplifier means, said control signal is provided on the output terminal of said amplifier means and is an algebraic summation of said first and second signal.

4. The circuit arrangement according to claim 3 wherein said first resistor means and said second resistor means are of equal resistance.

5. The circuit arrangement according to claim 3 wherein said difference amplifier means further comprises:
    difference amplifier having a negative input terminal, a positive input terminal and an output terminal;
    a feedback loop connecting said output terminal to said negative input terminal and including in cascade arrangement a capacitor means and a feedback resistor means;
    a first input resistor means connected to said negative terminal and said first signal; and
    a second input resistor means connecting said positive terminal to said node point.

6. The circuit arrangement according to claim 5 wherein said first input resistor means has a resistance approximately equal the sum of resistance of said second input resistor means plus said first resistor means which is also approximately equal the resistance sum of said second input resistor means plus said second resistor means.

* * * * *